United States Patent [19]

Kawamoto

[11] Patent Number: 5,335,206
[45] Date of Patent: Aug. 2, 1994

[54] SEMICONDUCTOR STORAGE DEVICE
[75] Inventor: Satoru Kawamoto, Kasugai, Japan
[73] Assignees: Fujitsu Limited, Kawasaki; Fujitsu VLSI Limited, Kasugai, both of Japan
[21] Appl. No.: 720,501
[22] PCT Filed: Nov. 7, 1990
[86] PCT No.: PCT/JP90/01443
  § 371 Date: Jun. 25, 1991
  § 102(e) Date: Jun. 25, 1991
[87] PCT Pub. No.: WO91/06956
  PCT Pub. Date: May 16, 1991
[30] Foreign Application Priority Data
  Nov. 7, 1989 [JP] Japan .................. 1-289117
[51] Int. Cl.$^5$ .................. G11C 7/00; G11C 8/00
[52] U.S. Cl. .................. 365/233.5; 365/230.01; 365/233
[58] Field of Search .................. 365/230.01, 233.5, 233
[56] References Cited
  U.S. PATENT DOCUMENTS

| | | | |
|---|---|---|---|
| 4,689,771 | 8/1987 | Wang et al. | 365/233.5 |
| 4,712,197 | 12/1987 | Sood | 365/233.5 |
| 4,912,679 | 3/1990 | Shinoda et al. | 365/230.01 |
| 4,947,379 | 8/1990 | Okuyama | 365/233.5 |

FOREIGN PATENT DOCUMENTS

| | | | |
|---|---|---|---|
| 0182457 | 5/1986 | European Pat. Off. | |
| 0337202 | 10/1989 | European Pat. Off. | |
| 0000690 | 1/1985 | Japan | 365/233.5 |
| 60-224190 | 11/1985 | Japan | 11/34 |
| 61-271696 | 12/1986 | Japan | 11/34 |
| 62-149099 | 7/1987 | Japan | 11/34 |
| 1-21790 | 1/1989 | Japan | 11/34 |

OTHER PUBLICATIONS

IBM Technical Disclosure Bulletin, vol. 31, No. 12, May 12, 1989, New York, U.S. pp. 130–132; 'Pipeline Memory System for DRAMs'.

Primary Examiner—John Zazworsky
Attorney, Agent, or Firm—Armstrong, Westerman, Hattori, McLeland & Naughton

[57] ABSTRACT

The present invention relates to a semiconductor storage device for executing an address multiplex method. An object of the invention is to provide a semiconductor storage device capable of higher access speed, and the semiconductor storage device includes a first timing circuit (1) for detecting a time at which a row address strobe signal is inactivated and for outputting a first timing signal; a second timing circuit (1) for detecting a time change from the inactive state to the active state of the row address strobe signal and for outputting a second timing signal; an address change detection circuit (5) for detecting a change of content of a row address signal between the first timing signal and the second timing signal and for outputting an address change signal; a row decoder (13) for decoding the content of the row address signal in accordance with the first timing signal, and when the address change signal is output, for decoding the content of the row address signal in accordance with the second timing signal; and a word line driver (14) for activating the decoded word line in accordance with the second timing signal; and is applied to a random access memory.

4 Claims, 10 Drawing Sheets

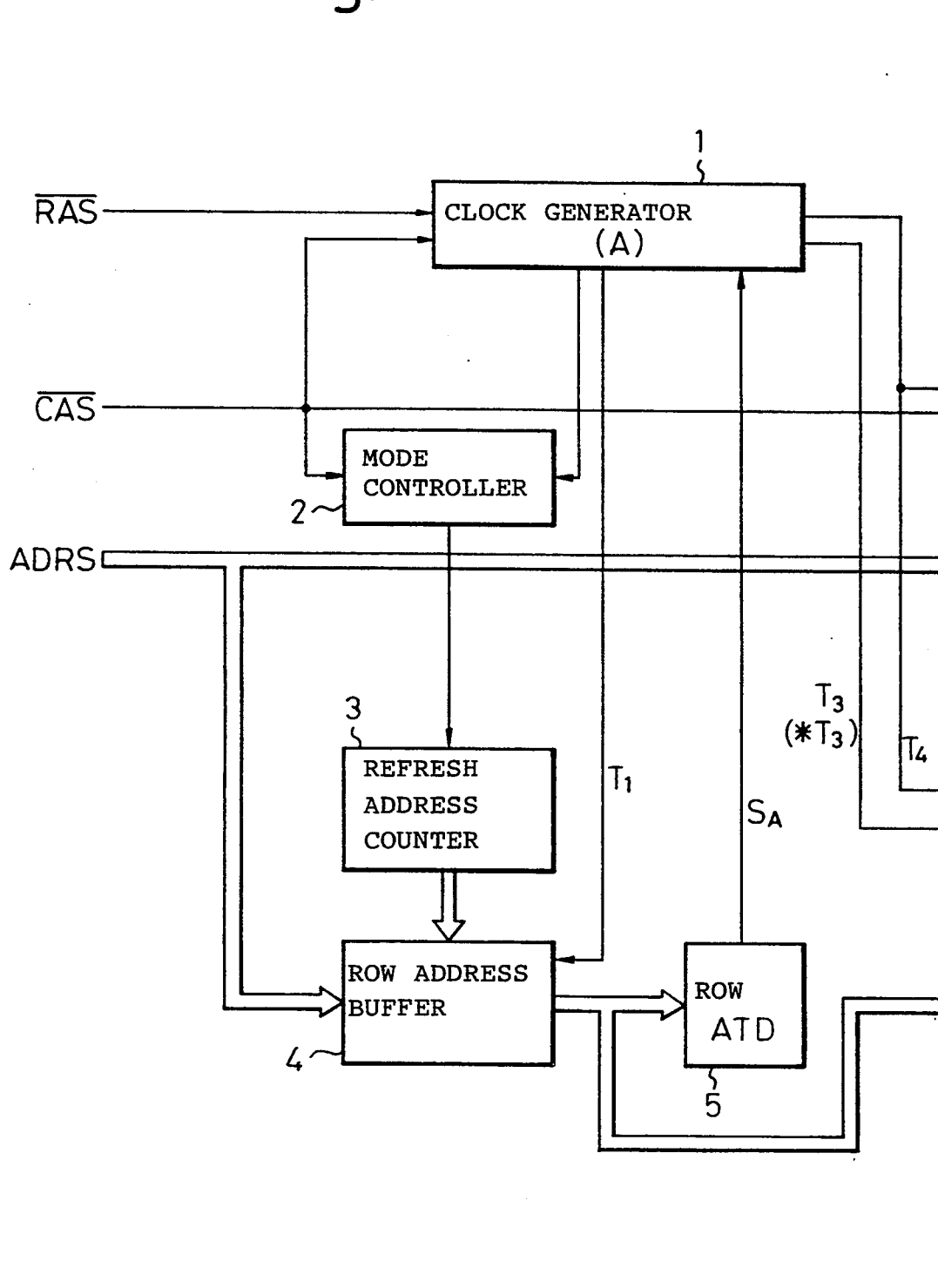

SEMICONDUCTOR STORAGE DEVICE

TECHNICAL FIELD

The present invention relates to a semiconductor storage device, and particularly to an address multiplexed semiconductor storage device.

BACKGROUND ART

Generally, in a DRAM (dynamic random access memory) the contents of all the memory cells in a specified row are read by a sense amplifier, and the contents are rewritten in the same memory cells, thus completing a basic operating cycle. If the contents of all of the bits in a specified column are read and output externally, the operation is a read cycle. If the contents of the bits in a specified column are changed before rewriting, the operation is a write cycle. If both processes are executed, the operation is a read (modify) write cycle.

As described above, in a DRAM, first, a row is read, and a column is selected thereafter, wherein a row address and a column address are obtained from memory using a time division or a so-called multiplex method.

In this conventional semiconductor storage device prior art, the multiplexed row address signal and column address signal are obtained from memory in accordance with a row address strobe signal (hereinafter, $\overline{RAS}$) and a column address strobe signal (hereinafter $\overline{CAS}$). Both of these strobe signals are negative logic signals and the falling edge is defined as an address signal fetch timing. Accordingly, in the $\overline{RAS}$ or $\overline{CAS}$, the signal is changed from inactive to active at the falling edge and is changed from active to inactive at the rising edge.

Namely, for example, in a DRAM comprising N channel MOS transistors, a circuit is precharged at the rising edge of the $\overline{RAS}$, at the falling of the $\overline{RAS}$ a circuit on the row side is operated dynamically and the row address signal is fetched. Then, after the content of the signal is decoded and one of word lines is selected and activated, a circuit on the column side is operated dynamically at the falling of the $\overline{CAS}$ and the column address signal is fetched. Further, the content of the signal is decoded, one bit line is selected, and one memory cell connected to the above one word line and one bit line is accessed.

In such a DRAM, however, the time required to access one memory cell starts from the falling of the $\overline{RAS}$ and until the time of data outputting. In this case, since the operation of the column side, in response to the fall of the $\overline{CAS}$, does not start immediately after the operation of the row side, sufficiently high speed access is not achieved.

As another prior art example, a DRAM using a so-called fast column method is known wherein each circuit is precharged at the rising of the $\overline{RAS}$, at an appropriate time after the falling of the $\overline{RAS}$ an internal timing signal is generated, and in accordance with this signal, the column address is automatically fetched. In this DRAM, a memory cell can be accessed without waiting for the falling of the $\overline{CAS}$, and a high speed operation can be planned.

In such a conventional DRAM using the fast column method, however, although an effect which is substantially equivalent to advancing the falling time of the $\overline{CAS}$ is obtained, since access start timing for the row side input address assigned to memory depends on the falling time of the $\overline{RAS}$, there is a problem in that it is necessary to plan for higher access speed.

DISCLOSURE OF THE INVENTION

An object of the present invention is to provide a semiconductor storage device wherein the access start time is advanced more than the falling time of the $\overline{RAS}$, in the address fetching time for the memory, and a higher access speed is made possible.

According to the present invention, to achieve the above object, there is provided a semiconductor storage device comprising a first timing circuit for generating a first timing signal in response to inactivation of a row address strobe signal; a second timing circuit for generating a second timing signal in response to activation of the row address strobe signal after the inactivation of a row address strobe signal; an address change detection circuit for generating an address change detection signal in response to a change of the row address which has occurred during a period between the inactivation and activation of the row address signal; a row decoder decoding a row address for subsequent access in response to the first timing signal and simultaneously decoding a changed row address signal in response to the second timing signal when the address change detection signal is generated; a word driver, connected to the row decoder, selecting a word line and being activated in response to the second timing signal.

In this invention, the row address signal is fetched and decoded at a rising time of the row address strobe signal ($\overline{RAS}$), and the word line is activated at a falling time of the $\overline{RAS}$. If at the falling time of the $\overline{RAS}$, the content of the row address signal has been changed, however, the content after that change is decoded and the word line is activated.

For the above reason, when the content of the row address signal does not change, before the falling time of the $\overline{RAS}$, a decode operation can be completed and thus the selection and activation of the word line can be advanced.

Accordingly, if this invention and the above-mentioned fast column method are used together, after the activation of a word line, a memory cell can be immediately accessed and a higher access speed can be realized.

BRIEF EXPLANATION OF DRAWINGS

FIG. 1 is a diagram showing a combination of FIG. 1A and FIG. 1B;

FIG. 1A and FIG. 1B are block diagrams of a semiconductor storage device according to an embodiment of the present invention;

BEST MODE FOR CARRYING OUT THE INVENTION

Figure 1B:
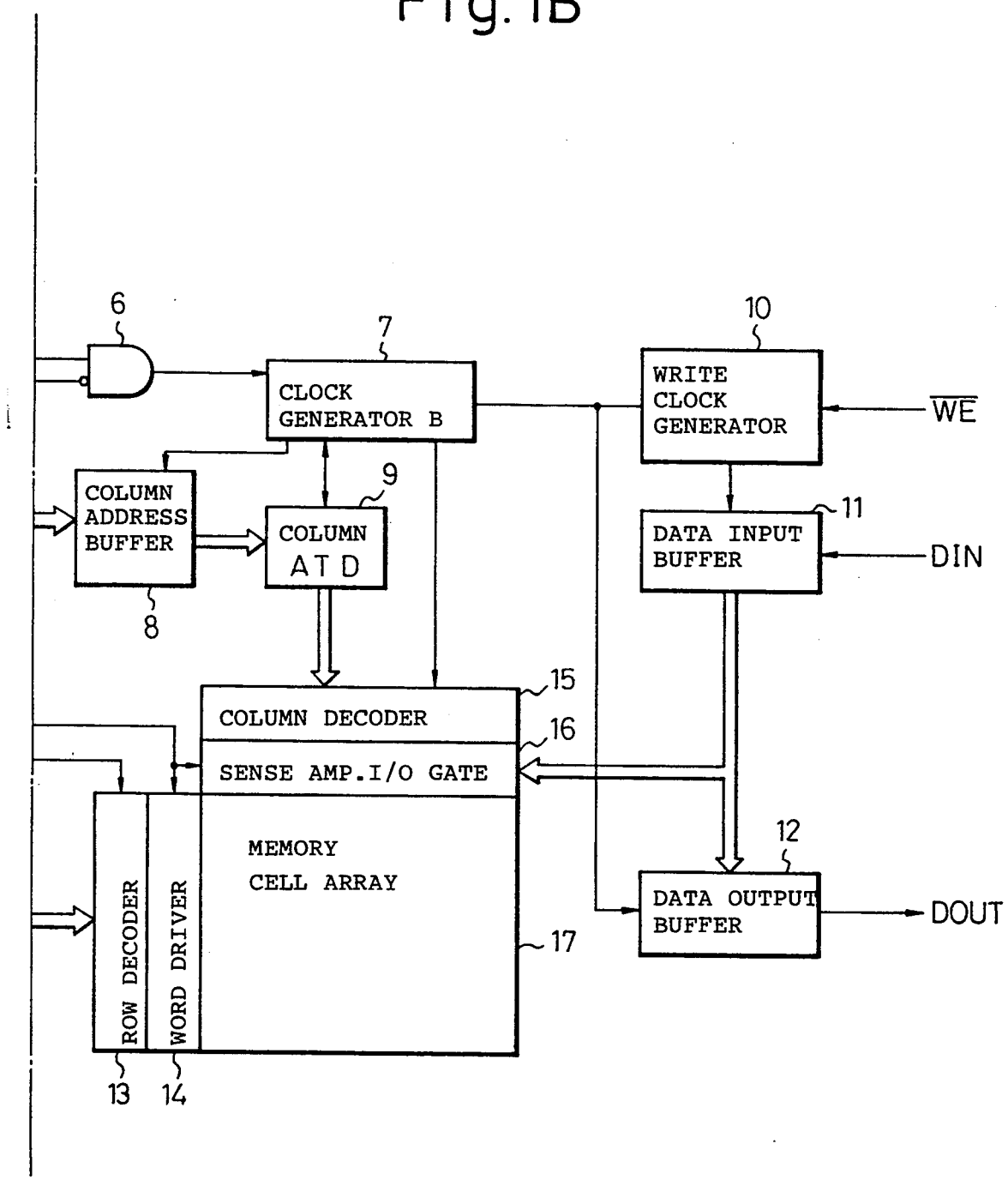

FIG. 1 is a block diagram showing an embodiment of a semiconductor storage device according to the present invention, as an example applied to a DRAM.

In FIG. 1, 1 denotes a clock generator (A), 2 denotes a mode controller, 3 denotes a refresh address counter, 4 denotes a row address buffer, 5 denotes a row address transition detector (hereinafter, row ATD), 6 denotes an AND gate, 7 denotes a clock generator (B), 8 denotes a column address buffer, 9 denotes a column address transition detector (hereinafter, column ATD), 10 denotes a write clock generator, 11 denotes a data input buffer, 12 denotes a data output buffer, 13 denotes a row decoder, 14 denotes a word driver, 15 denotes a column decoder, 16 denotes a sense amplifier I/O gate, and 17 denotes a memory cell array. Regarding the signals in the figure, $\overline{RAS}$ is a row address strobe signal, $\overline{CAS}$ is a column address strobe signal, ADRS is a row/column address signal, $\overline{WE}$ is a write enable signal, DIN is input data, DOUT is output data, $T_1$ to $T_4$ are timing signals, and $S_A$ is an address change signal.

The clock generator (A) 1 functions as a first timing circuit and a second timing circuit. Namely, it detects a rising edge and a falling edge of the $\overline{RAS}$ and when detecting these signals, outputs the following timing signals.
(1) A signal output at the rising timing of the $\overline{RAS}$ (first timing signal)
For example, $T_1$, $T_3$
(2) A signal output at the falling timing of the $\overline{RAS}$ (second timing signal)
For example, $T_1$, *$T_3$, $T_4$ The $T_3$ in the above signals is output also at the timing (2) ($T_3$ with an asterisk *) only when the $S_A$ is output from the row ATD 5.

The row ATD 5 functions as an address change detection circuit, the content of the row address signal which is input through the row address buffer 4 is monitored, and the content of the row address signal at the rising time of the $\overline{RAS}$ is compared with that at the falling time. Then, if the content changes, the signal $S_A$ is output.

The row decoder 13 decodes the content of the row address signal and selects one of word lines in accordance with the $T_3$ (* $T_3$). Namely, the row decoder
i) starts to decode in accordance with content of the row address signal at the rising time ($T_3$) of the $\overline{RAS}$, and,
ii) decodes in accordance with the content of the row address signal (the content after change), at the falling time (* $T_3$) of the $\overline{RAS}$, when the content of the row address changes between the rising time and the falling time of the $\overline{RAS}$.

The word driver 14 receives the above decoded output and starts to activate the selected word line in accordance with the falling time ($T_4$) of the $\overline{RAS}$.

The clock generator (B) 7 obtains information of the rising time ($T_4$) of the $\overline{RAS}$ and the falling time of the $\overline{CAS}$ through the AND gate 6, and simultaneously executes the fast column function by controlling the column address buffer 8 or the column ATD 9, and by automatically fetching the column address signal after the predetermined time from the falling time of the $\overline{RAS}$.

In addition, in this invention, the row address buffer 4, the row ATD 5, and the row decoder 13 on the row address input side are circuits which operate statically. For example, if these elements are constituted by CMOS, low power consumption can be easily accomplished using a small number of elements. It is also possible to constitute a static operation circuit using n or p MOS transistors.

Next, the operation of this embodiment is explained with reference to the timing chart of FIG. 2.

First, at the rising time of the $\overline{RAS}$, $T_1$ and $T_3$ are output, the row address signal is fetched from the row address buffer 4 to the row ATD 5 and the row decoder 13, and the row decoder 13 decodes the content (ROW) thereof. Thereafter the $\overline{RAS}$ falls and the $T_4$ is output, the decoded signal is received, and the word driver 14 activates one word line. After a predetermined time the column address signal is fetched automatically in accordance with a flow-through latch function, the content (Column) thereof is decoded, and one bit line is selected. As a result, for example, if the operation is a read cycle, the output data is read at the DOUT.

According to this embodiment, since at the falling time of the $\overline{RAS}$, the selection (decoding) of the word line is already completed; the start time of the activation of the word line can be advanced in time as much as necessary for the word line selection. Thus, the row address access time (tRAC) from the falling time of the $\overline{RAS}$ until the acquisition of the output data (in the case of a read cycle) can be decreased.

In addition, if the content of the row address signal changes between the rising time and the falling time of the $\overline{RAS}$, in synchronization with the falling of the $\overline{RAS}$, the decoding of the word line starts in accordance with the content after the change. The reason is as follows.

In other words, in the DRAM of this embodiment, during a high level period of the $\overline{RAS}$, the row address signal is inputted so that a high speed access can be carried out (e.g., when the address input definition is not satisfied or when the user wishes to use the DRAM as a typical DRAM), since the row address signal is usually defined at the falling time of the $\overline{RAS}$, and the content of the row address signal is not clear before the falling of the $\overline{RAS}$. Accordingly, in the usual use, since the wrong result is generated, the change of the content of the row address signal between the rising time and the falling time of the $\overline{RAS}$ is detected, and until the detected result is obtained, the word line is not activated, in this embodiment. As a result, at the falling time of the $\overline{RAS}$, the usual fetching of the row address signal is executed and the compatibility with the conventional DRAM can be also secured.

As mentioned above, in the embodiment, at the rising time of the $\overline{RAS}$, the content of the row address signal is decoded, and if the content does not change, the word line immediately starts to be activated at the falling time of the $\overline{RAS}$. Therefore, by using this embodiment together with the fast column method, the row address access time (tPAC) is decreased and a higher access speed can be realized.

Figure 3:
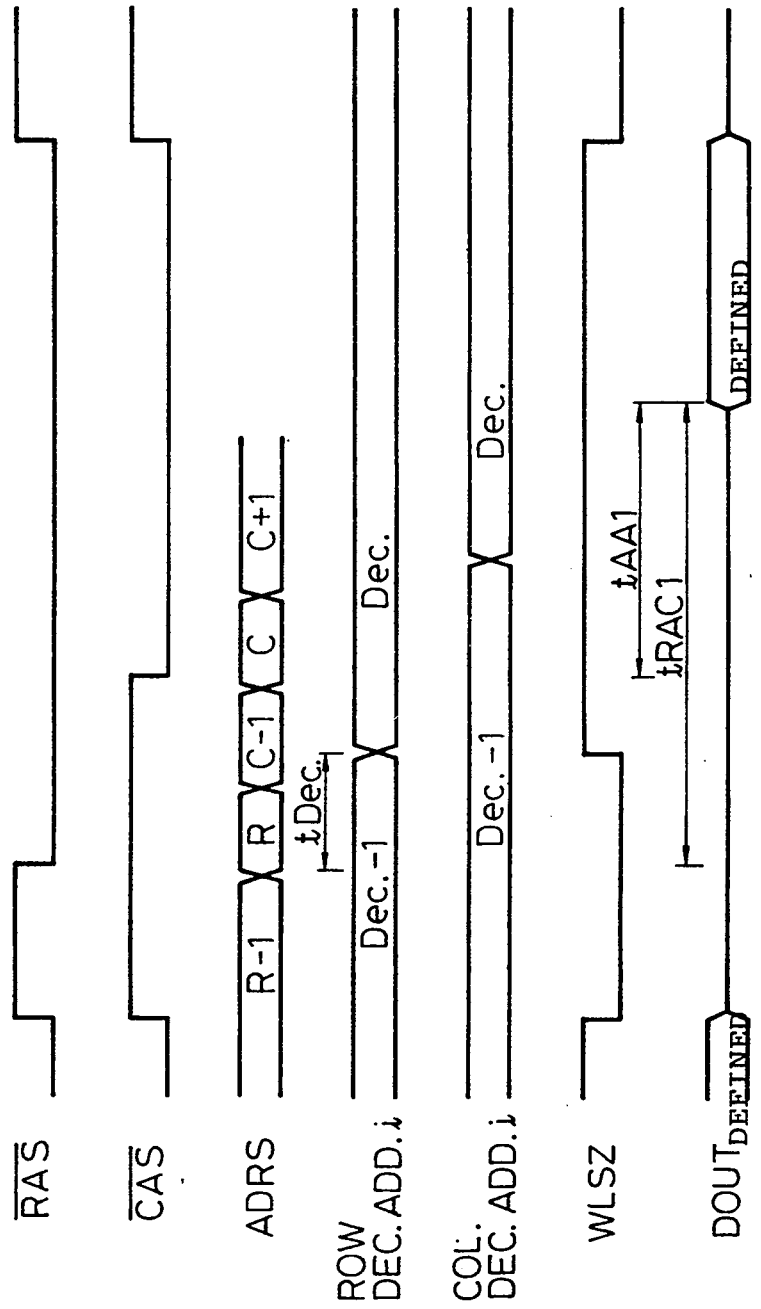
FIG. 3 and FIG. 4 are timing charts of a conventional example of the semiconductor storage device.
Figure 4:
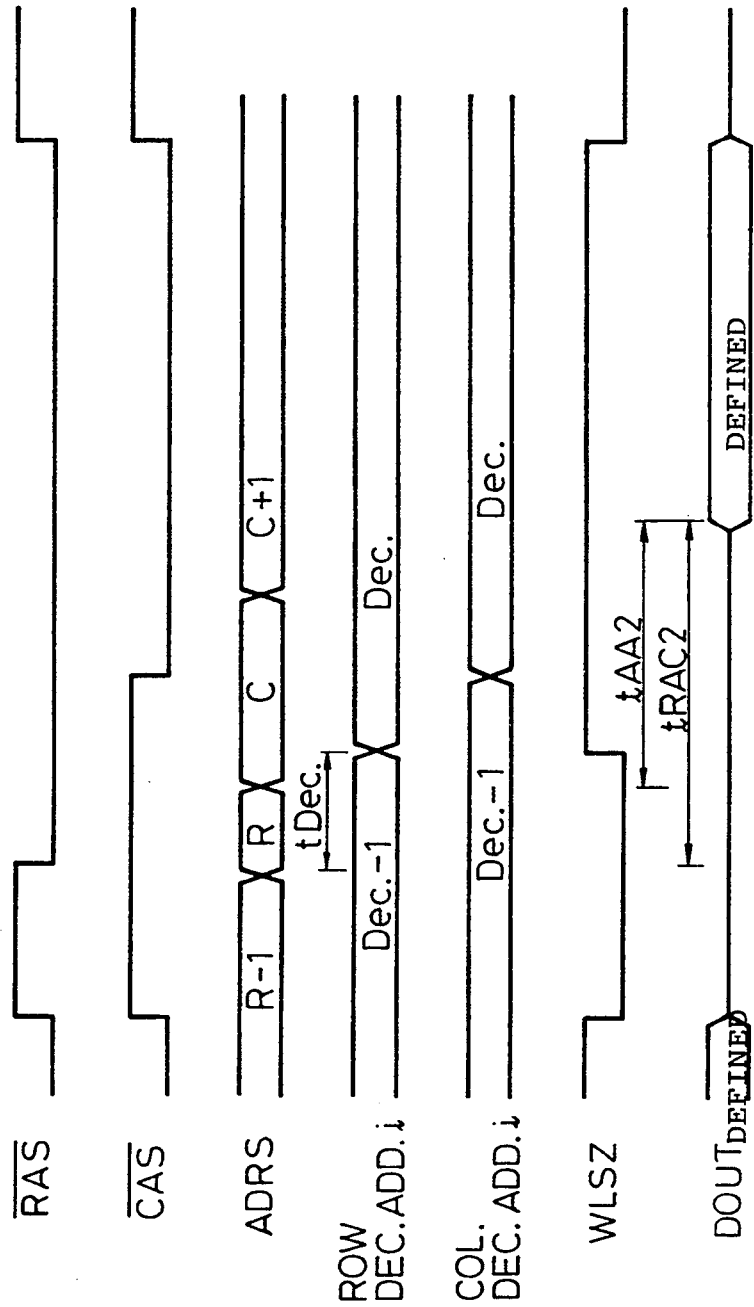
Figure 5:
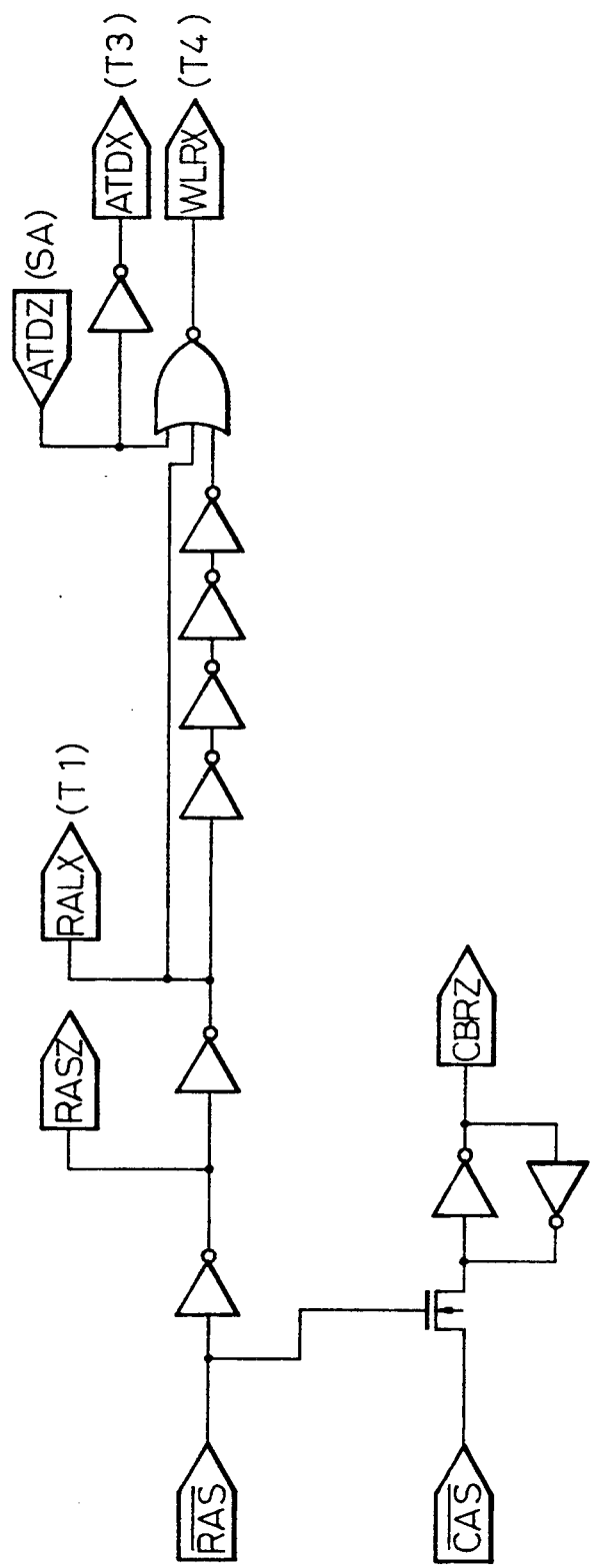
FIG. 5 is a circuit diagram of a clock generator (A) in the semiconductor storage device of FIG. 1A and FIG. 1B.
Figure 6:
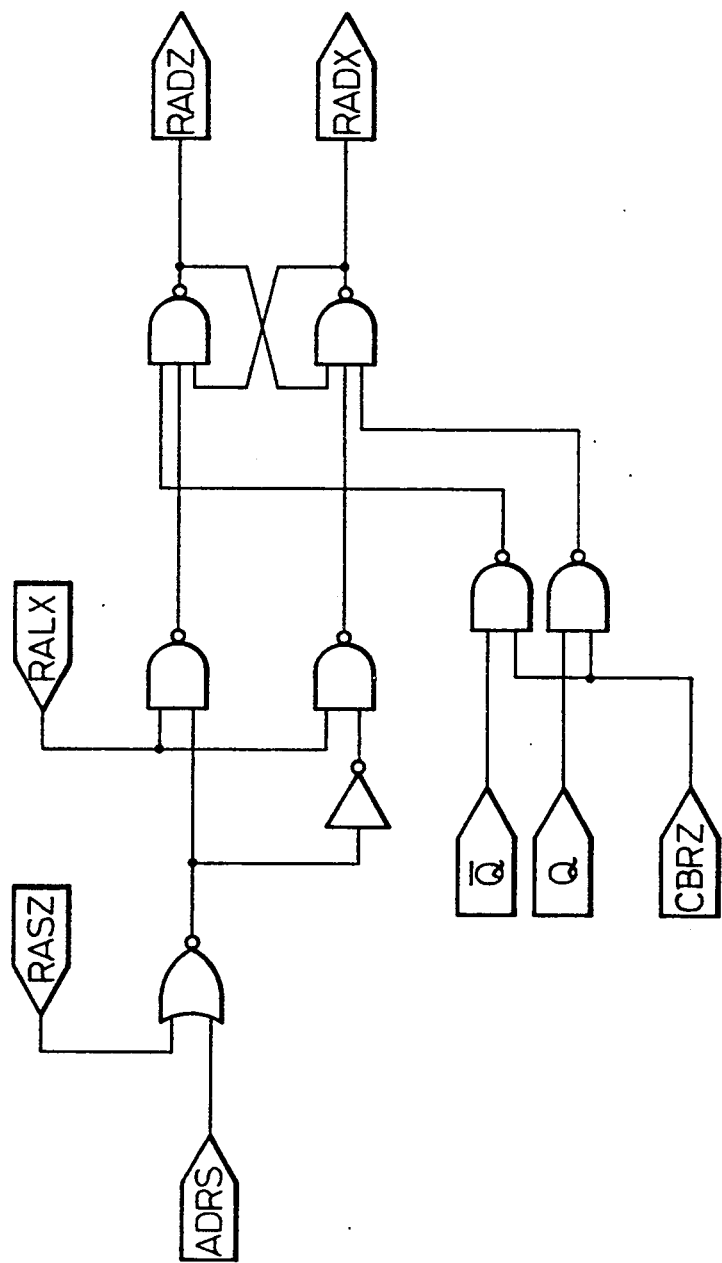
FIG. 6 is a circuit diagram of a row address buffer in the semiconductor storage device of FIG. 1A and FIG. 1B.
Figure 7:
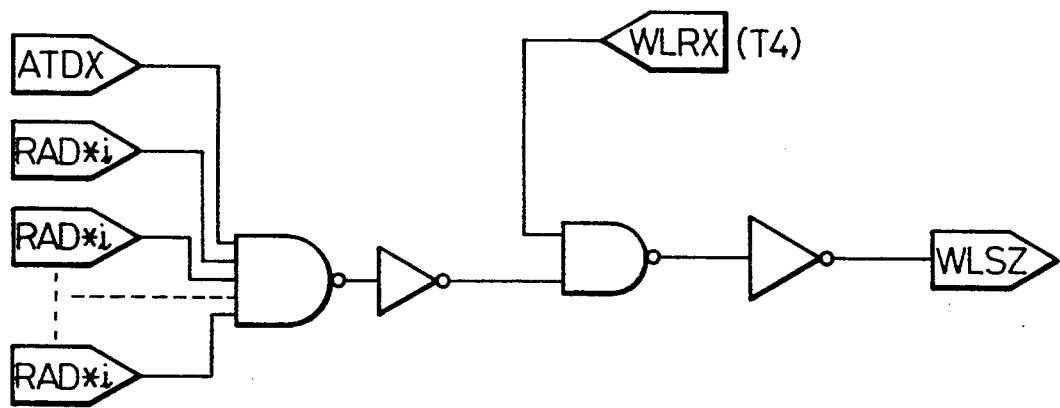
FIG. 7 is a circuit diagram of a row decoder and a word driver in the semiconductor storage device of FIG. A and FIG. 1B.
Figure 8:
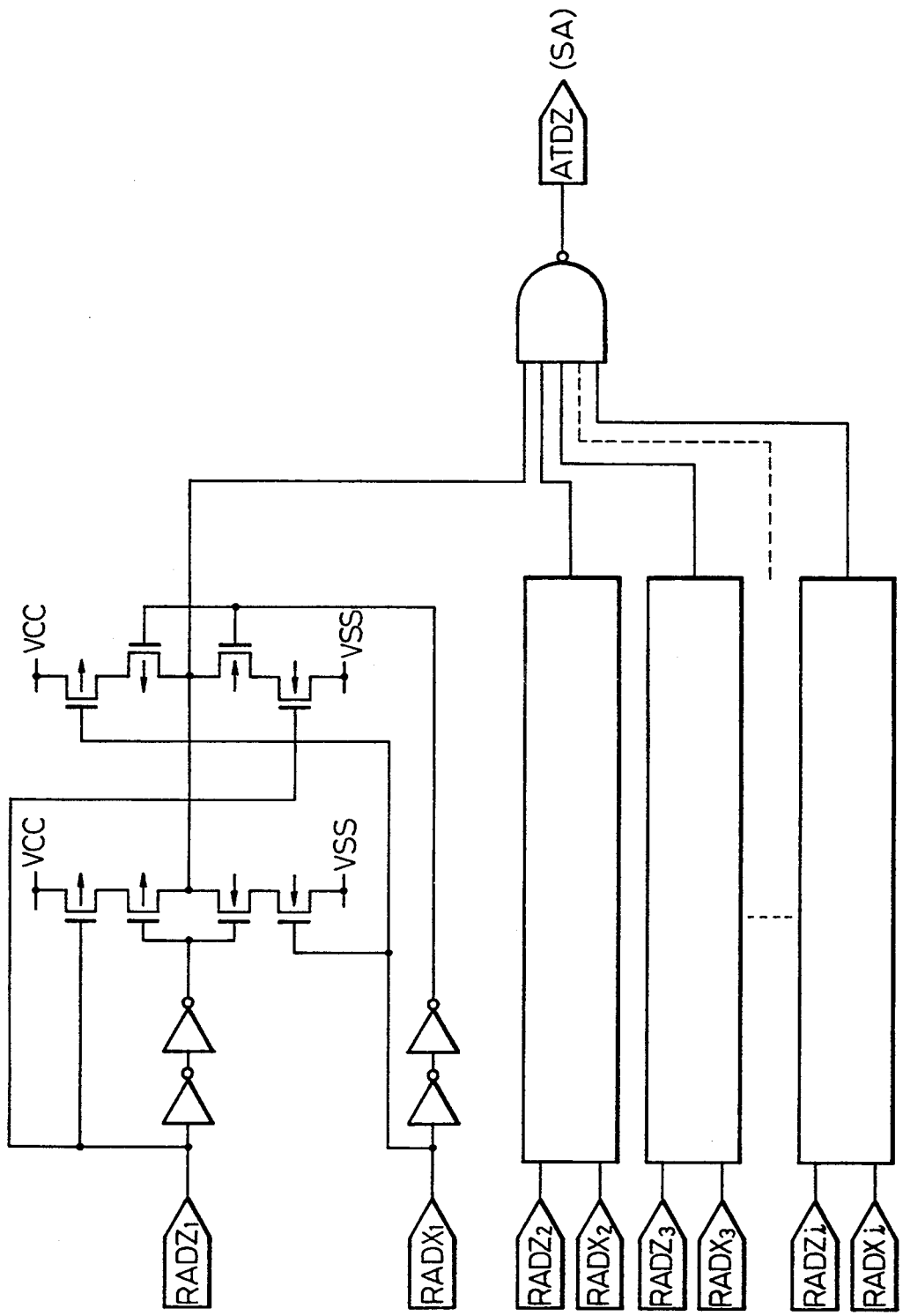
FIG. 8 is a circuit diagram of a row address transition detector in the semiconductor storage device of FIG. 1A and FIG. 1B.

FIG. 3 and FIG. 4 are timing charts for explaining a conventional example. FIG. 3 shows the timing of a usual DRAM and FIG. 4 shows the timing when only the fast column method is executed. Namely, in FIG. 3, the address decodes the row and the column start at the falling of the $\overline{RAS}$ and the $\overline{CAS}$, respectively, however, in FIG. 4, the row address decoding starts at the falling of the $\overline{RAS}$, and after that the address decoding of the column address automatically starts. Comparing the timing chart of FIG. 3 with that of FIG. 4, the example in FIG. 4 operates at higher speed due to the advance of the start of decoding of the column address.

Figure 2:
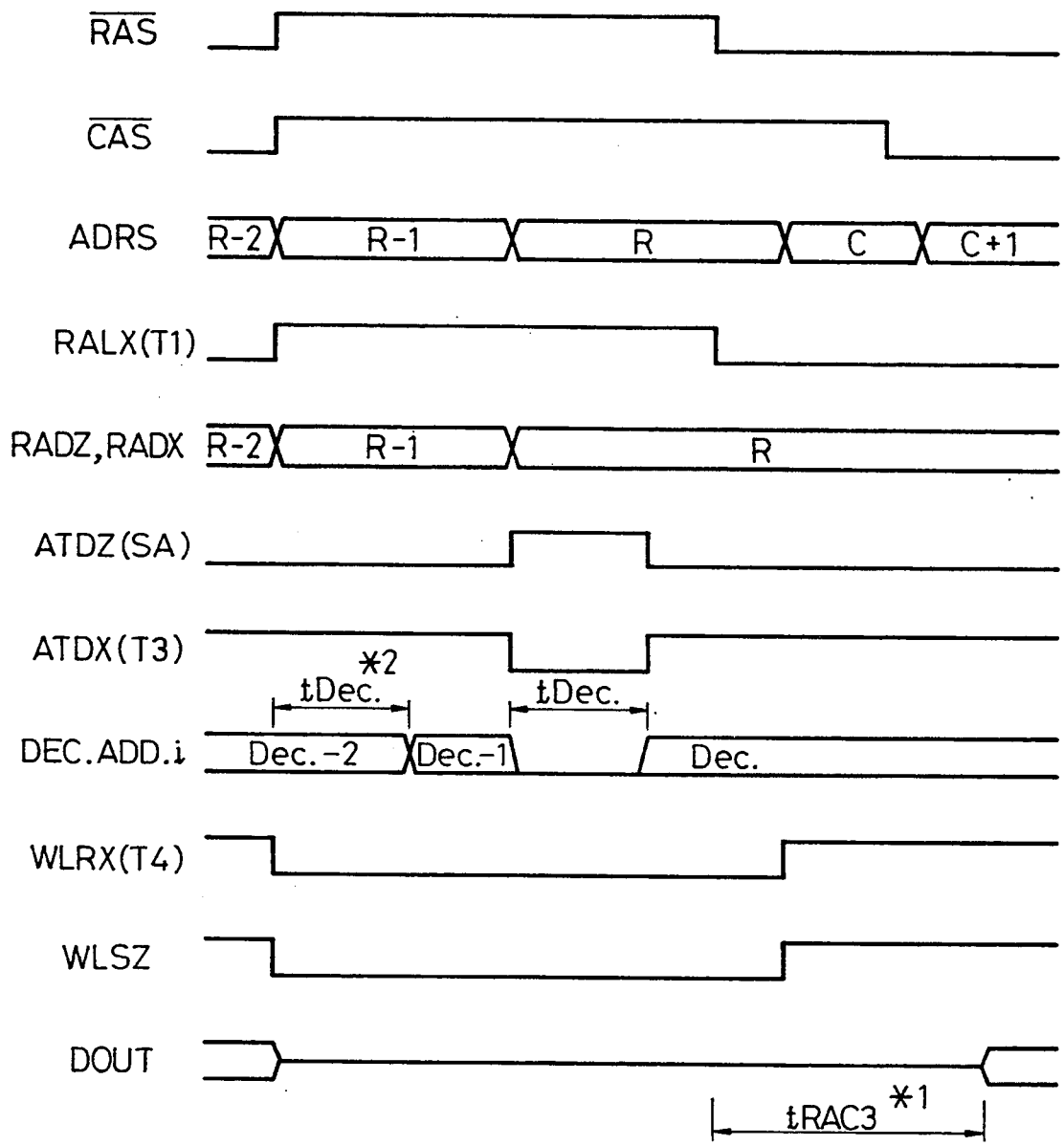
FIG. 2 is a timing chart of the semiconductor storage device of FIG. 1A and FIG. 1B.

On the other hand, in the embodiment of FIG. 2, since the decoding of the row address is already completed at the falling time of the $\overline{RAS}$, the start of the decoding of the column address can be advanced by the time needed for the decoding in comparison with the operation in FIG. 4. Therefore, the operation of FIG. 2 is the highest speed among the examples of FIG. 2 to FIG. 4.

In FIG. 5 to FIG. 8, detailed circuit diagrams of elements of the semiconductor storage device according to this embodiment are shown.

The clock generator (A) (FIG. 5) outputs CBRZ for receiving the $\overline{RAS}$ and for determining whether a normal mode or refresh mode is in effect, in response to the state of the $\overline{CAS}$, RASZ for controlling the input of the row address buffer, RALX ($T_1$) for latching the address, ATDX ($T_3$) for receiving ATDZ (SA) signal which is the signal from the ATD circuit for controlling the row decoder, and WLRX ($T_4$) for controlling the word driver.

The row address buffer (FIG. 6) receives an external input signal ADRS and outputs complementary signals RADZ and RADX of the address. In the refresh mode, the refresh counter address (Q, $\overline{Q}$) of the chip content is input, and the address signals RADZ and RADX are output.

The row decoder and word driver (FIG. 7) receive the combined address input RAD,i (* is Z or X, i is an address number) in response to the address, output a decode signal in accordance with the control signal ATDX ($T_3$) from the clock generator (A), receive the word driver control signal WLRX ($T_4$), and drive the word line WLSZ.

The row ATD (FIG. 8) receives ADZi and RADXi (i is address number) from the respective complementary address signals RADZ and RADX, and outputs the ATDZ (SA).

These logic elements are constituted to operate in a static manner.

Figure 9:
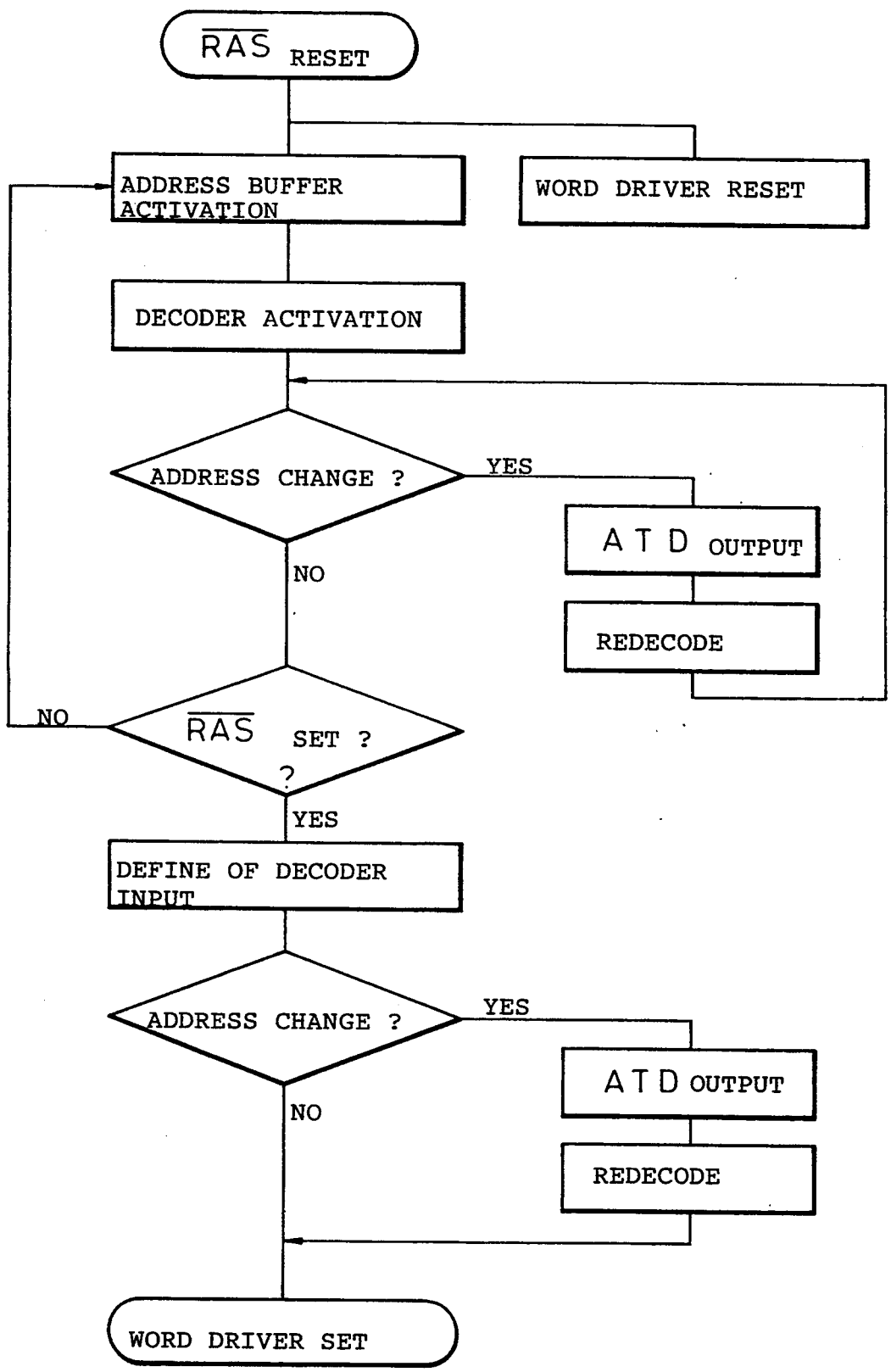
FIG. 9 is a flowchart explaining processing steps in the semiconductor storage device of FIG. 1A and FIG. 1B.

FIG. 9 is a flowchart for explaining the process steps of the semiconductor storage device according to this embodiment.

I claim:

1. A semiconductor storage device, comprising:
   a first timing circuit for generating a first timing signal in response to inactivation of a row address strobe signal;
   a second timing circuit for generating a second timing signal in response to activation of the row address strobe signal after the inactivation of a row address strobe signal;
   an address change detection circuit for generating an address change detection signal in response to a change of the row address which has occurred during a period between the inactivation and activation of the row address signal;
   a row decoder decoding a row address for subsequent access in response to the first timing signal and simultaneously decoding a changed row address signal in response to the second timing signal when the address change detection signal is generated; and
   a word driver, connected to the row decoder, selecting a word line and being activated in response to the second timing signal.

2. A semiconductor storage device as set forth in claim 1, wherein the address change detection circuit is a row address transition detector which receives a complementary address signal, monitors the content of the row address signal, compares the contents of the row address signal during the rising or falling times of the row address strobe signal, and outputs the address change signal when the content changes.

3. A semiconductor storage device as set forth in claim 1, wherein said second timing signal is formed by a falling edge of the row address strobe signal and the address change signal.

4. A data access method of a semiconductor storage device, comprising the steps of:
   decoding a content of a row address signal during a term from inactivation to activation of a row address strobe signal, and simultaneously when the above address signal, change is outputted, decoding the content of the row address signal in accordance with a first timing signal;
   activating a word line in accordance with an input of the decoded signal after the row address strobe signal is activated; and then,
   in accordance with an input of a column address signal, obtaining information of one arbitrary memory cell.

* * * * *

UNITED STATES PATENT AND TRADEMARK OFFICE
CERTIFICATE OF CORRECTION

PATENT NO.:    5,335,206
DATED     :    August 2, 1994
INVENTOR(S):   Satoru KAWAMOTO It is certified that error appears in the above-identified patent and that said Letters Patent is hereby corrected as shown below:

Column 6, line 41, "above address signal, change" should be --above address change signal--.

Signed and Sealed this

Second Day of April, 1996

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO.:    5,335,206
DATED     :    August 2, 1994
INVENTOR(S):   Satoru KAWAMOTO It is certified that error appears in the above-identified patent and that said Letters Patent is hereby corrected as shown below:

Column 6, line 8, "the inactivation of a row address" should be --the inactivation of the row address--.
Column 6, line 14, "the row address signal" should be --the row address strobe signal--.

Signed and Sealed this

Second Day of July, 1996

BRUCE LEHMAN

Attest:

Attesting Officer

Commissioner of Patents and Trademarks